(12) United States Patent
Hirai et al.

(10) Patent No.: US 11,009,409 B2
(45) Date of Patent: May 18, 2021

(54) PRESSURE SENSOR DEVICE, CONTROL DEVICE, AND PRESSURE SENSOR UNIT

(71) Applicant: RENESAS ELECTRONICS CORPORATION, Tokyo (JP)

(72) Inventors: Masato Hirai, Tokyo (JP); Takeshi Yoshizawa, Tokyo (JP); Takeshi Kuwano, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 207 days.

(21) Appl. No.: 16/182,188

(22) Filed: Nov. 6, 2018

(65) Prior Publication Data

US 2019/0195703 A1    Jun. 27, 2019

(30) Foreign Application Priority Data

Dec. 22, 2017    (JP) .............................. JP2017-246349

(51) Int. Cl.
| | | |
|---|---|---|
| *G01R 27/26* | (2006.01) | |
| *G01L 1/14* | (2006.01) | |
| *G01R 15/16* | (2006.01) | |
| *G01R 31/64* | (2020.01) | |
| *G01R 19/00* | (2006.01) | |
| *G06F 3/044* | (2006.01) | |
| *G06F 3/041* | (2006.01) | |

(52) U.S. Cl.
CPC .............. *G01L 1/144* (2013.01); *G01R 15/16* (2013.01); *G01R 19/0084* (2013.01); *G01R 27/2605* (2013.01); *G01R 31/64* (2020.01); *G01L 1/146* (2013.01); *G06F 3/044* (2013.01); *G06F 3/0416* (2013.01); *G06F 3/0443* (2019.05); *G06F 3/0446* (2019.05)

(58) Field of Classification Search
CPC .... G01R 27/2605; G01R 15/16; G01R 31/64; G01R 19/0084; G06F 3/044; G06F 3/0416; G06F 3/0446; G06F 3/0443
USPC ........... 324/76.11–76.83, 459, 600, 649, 658
See application file for complete search history.

(56) References Cited

U.S. PATENT DOCUMENTS

| | | | |
|---|---|---|---|
| 2005/0005703 A1 | 1/2005 | Saito et al. | |
| 2006/0061385 A1* | 3/2006 | Jinta | G09G 3/3677 326/81 |
| 2011/0148811 A1* | 6/2011 | Kanehira | G06F 3/0446 345/174 |
| 2011/0309889 A1* | 12/2011 | Matsuzaki | H03K 3/017 331/111 |
| 2016/0320211 A1* | 11/2016 | Okami | G01P 15/125 |
| 2017/0279422 A1* | 9/2017 | Togawa | H03F 3/2173 |
| 2017/0322098 A1* | 11/2017 | Dawson | G01L 9/0072 |

FOREIGN PATENT DOCUMENTS

JP    2005-030901 A    2/2005

\* cited by examiner

*Primary Examiner* — Raul J Rios Russo
(74) *Attorney, Agent, or Firm* — McDermott Will & Emery LLP

(57) ABSTRACT

To improve the efficiency of pressure detection, a driver applies a positive-phase signal to a capacitance element from an opposite side to a coupling point in a control device. Another driver applies a reverse-phase signal to another capacitance element from an opposite side to the coupling point. A control unit detects pressures applied to the capacitance elements based on a potential fluctuation at the coupling point.

17 Claims, 6 Drawing Sheets

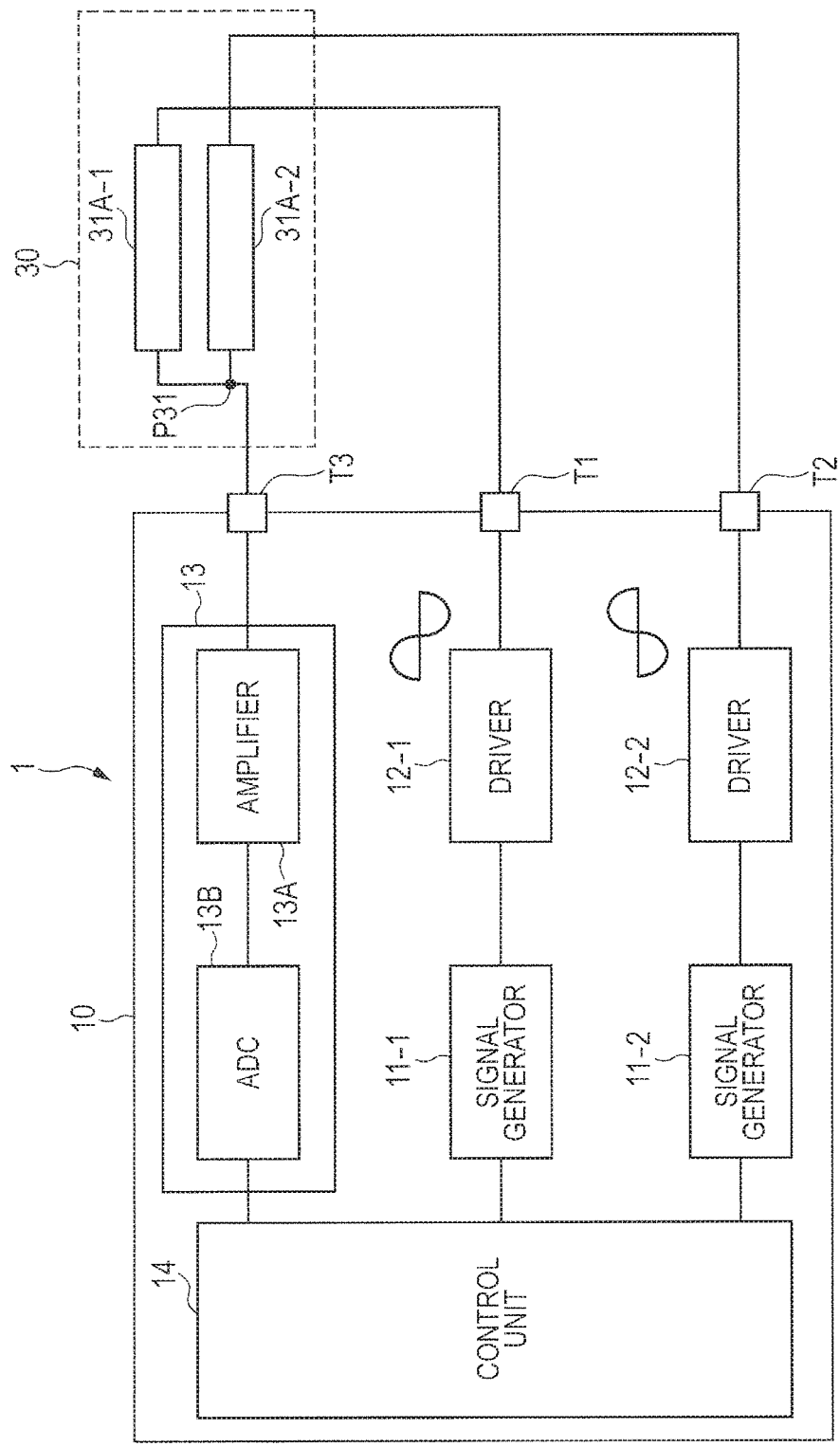

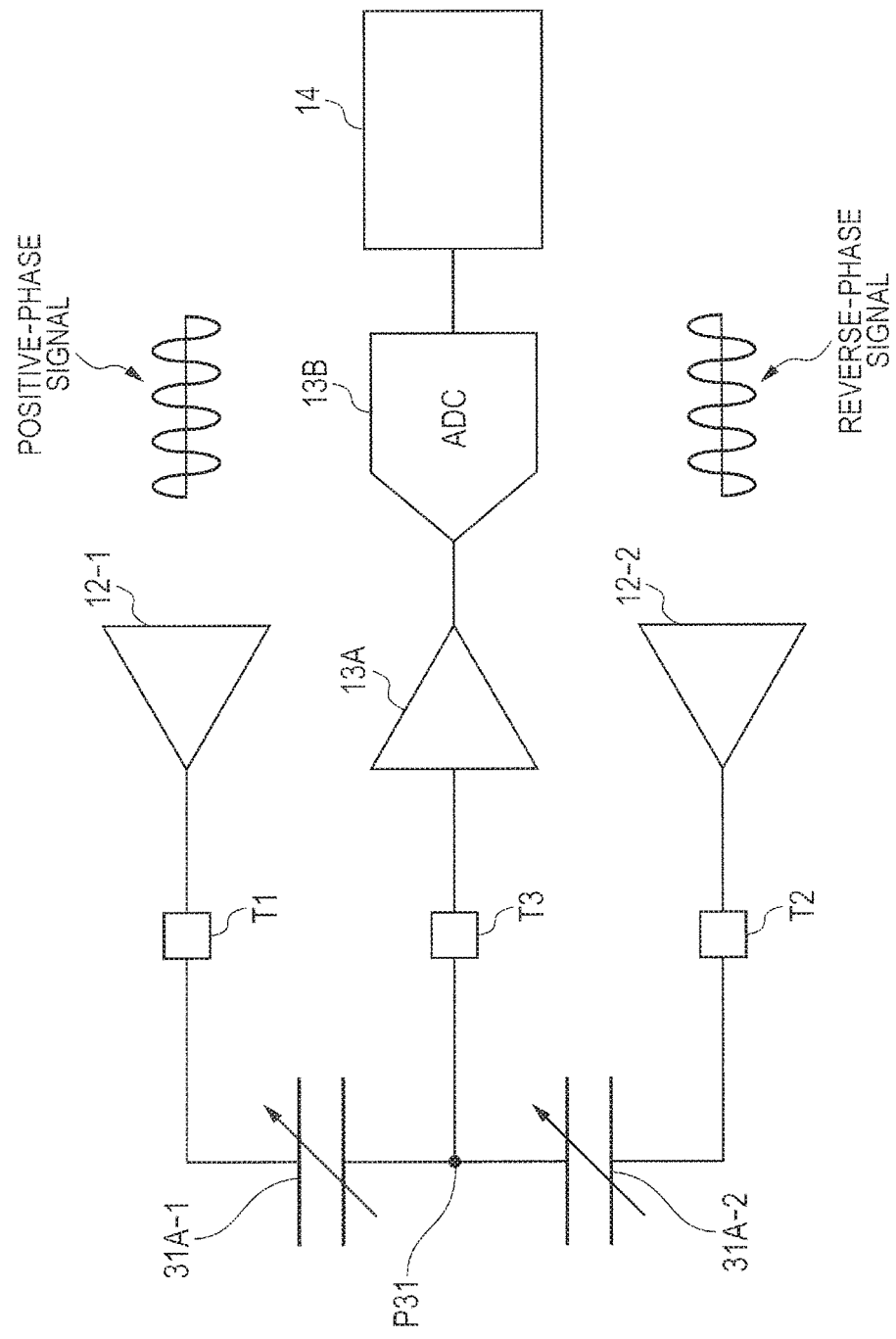

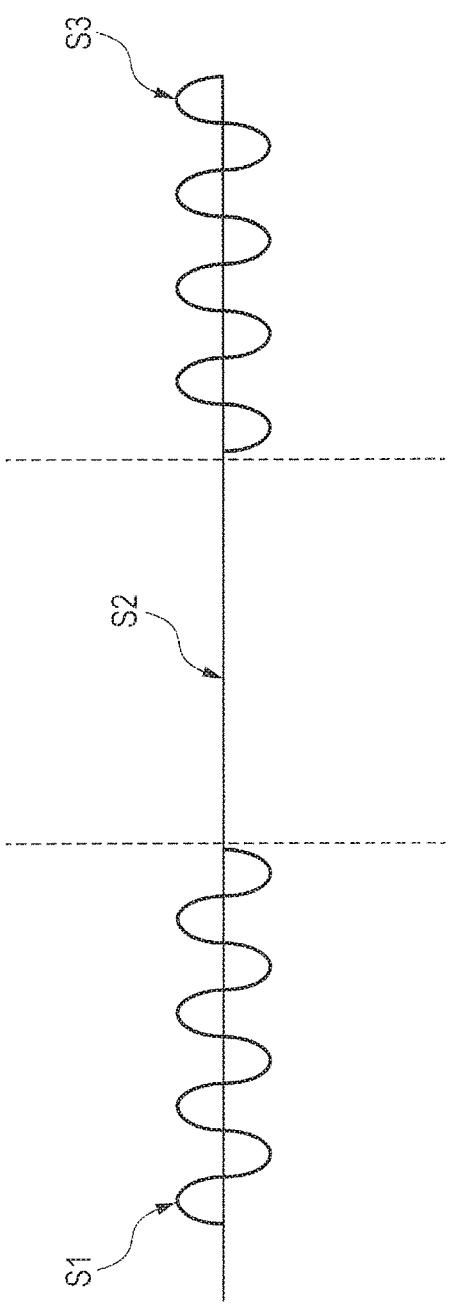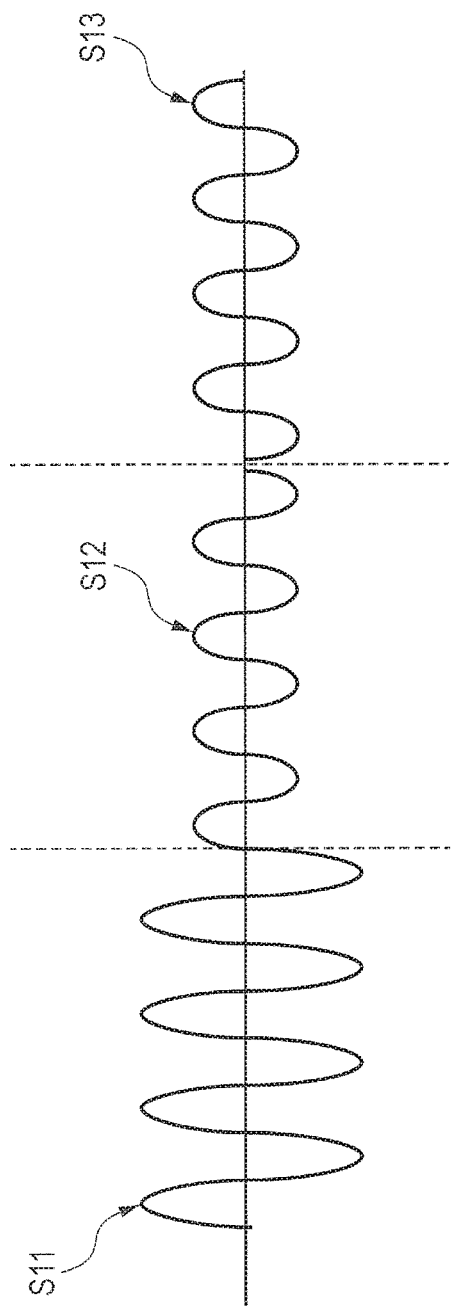

PRESSURE SENSOR DEVICE, CONTROL DEVICE, AND PRESSURE SENSOR UNIT

CROSS-REFERENCE TO RELATED APPLICATIONS

The disclosure of Japanese Patent Application No. 2017-246349 filed on Dec. 22, 2017 including the specification, drawings and abstract is incorporated herein by reference in its entirety.

BACKGROUND

The present invention relates to a pressure sensor device, a control device, and a pressure sensor unit.

Conventionally, there is known a capacitance sensor that inputs a pulse signal to a capacitor and detects a pressure applied to the capacitor by using a signal output from the capacitor (for example, Japanese Unexamined Patent Application Publication No. 2005-30901).

SUMMARY

However, it is likely that the efficiency of pressure detection is not good, because the pressure applied to one capacitor is detected at one timing.

Other objects and novel features will be apparent from the description of this specification and the accompanying drawings.

According to an embodiment, a positive-phase signal and a reverse-phase signal are respectively applied to a first capacitance element and a second capacitance element coupled in series to each other from an opposite side to a coupling point, and pressures applied to the first capacitance element and the second capacitance element are detected based on a potential fluctuation at the coupling point.

According to the embodiment, it is possible to improve the efficiency of pressure detection.

BRIEF DESCRIPTION OF THE DRAWINGS

FIG. 1 is a block diagram of an example of a pressure sensor device according to a first embodiment.

FIG. 2 is an explanatory diagram of a main operation of the pressure sensor device.

FIG. 3 is an explanatory diagram of a synthesized signal in an ideal state.

FIG. 4 is an explanatory diagram of a synthesized signal in a non-ideal state.

DETAILED DESCRIPTION

Figure 5:
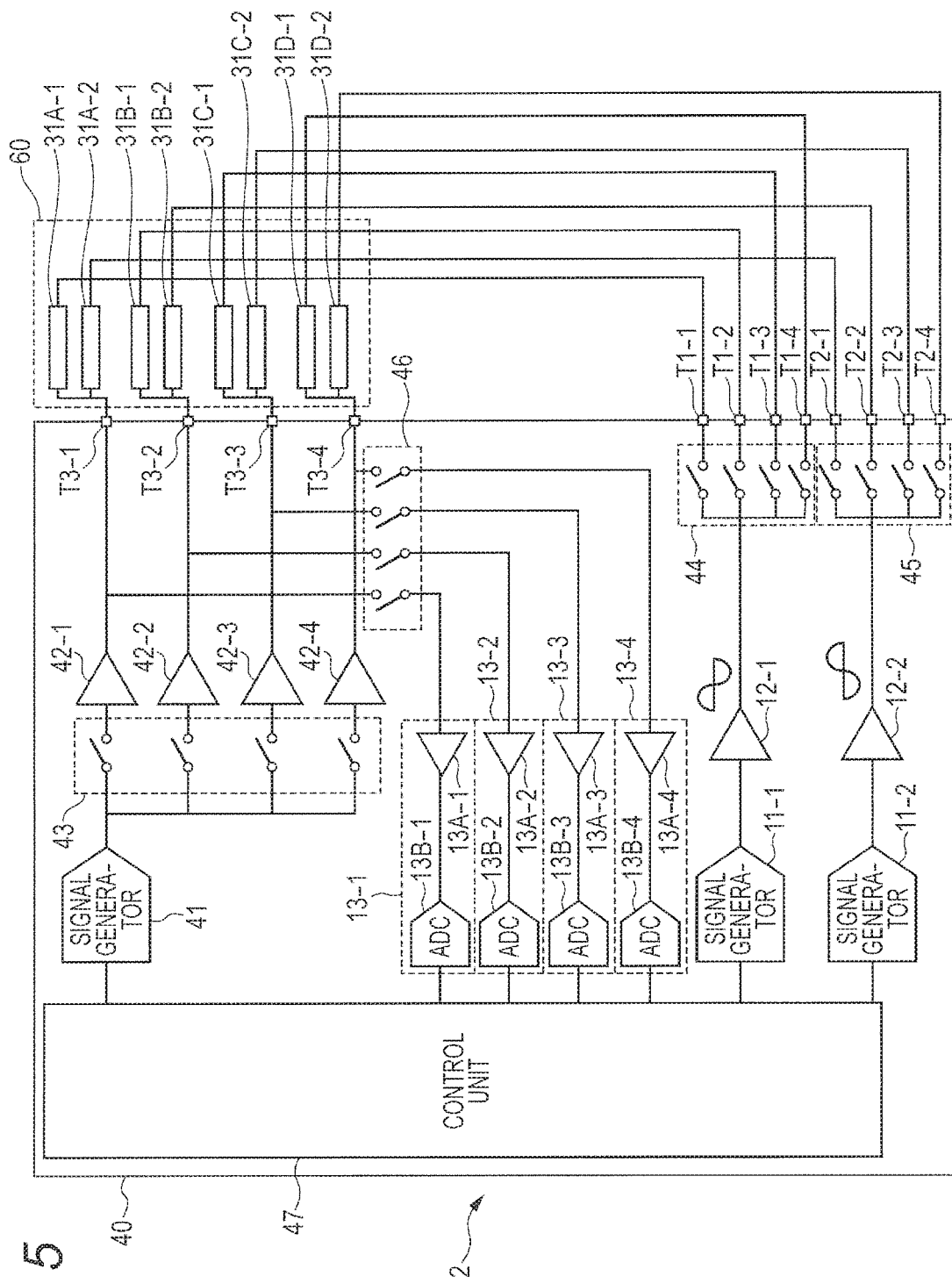
FIG. 5 is a block diagram of an example of a pressure sensor device according to a second embodiment.

Embodiments are described below referring to the drawings. The same component is labeled with the same reference sign, and redundant description is omitted.

First Embodiment

<Configuration Example of Pressure Sensor Device>

FIG. 1 is a block diagram of an example of a pressure sensor device according to a first embodiment. In FIG. 1, a pressure sensor device 1 includes a control device 10 and a pressure sensor unit (capacitor pair) 30. The pressure sensor unit 30 is electrically coupled to the control device 10 via terminals T1, T2, and T3 of the control device 10 as "loads". The pressure sensor unit 30 can be configured to be attachable to and detachable from the control device 10.

<Configuration Example of Pressure Sensor Unit>

As illustrated in FIG. 1, the pressure sensor unit 30 includes two capacitance elements 31A-1 and 31A-2. The capacitance elements 31A-1 and 31A-2 ideally have the same capacitance. The capacitance elements 31A-1 and 31A-2 are coupled in series to each other at a coupling point P31. The capacitance element 31A-1 is coupled to the coupling point P31 at one end and to the terminal T1 of the control device 10 at the other end. The capacitance element 31A-2 is coupled to the coupling point P31 at one end and to the terminal T2 of the control device 10 at the other end. The coupling point P31 is coupled to the terminal T3 of the control device 10. Thus, a "positive-phase signal" output from the terminal T1 of the control device 10 and a "reverse-phase signal" output from the terminal T2, both of which will be described later, pass through the capacitance element 31A-1 and the capacitance element 31A-2 and are synthesized at the coupling point P31. A synthesized signal at the coupling point P31 (that is, a "potential fluctuation") is input to the terminal T3 of the control device 10. The pressure sensor unit 30 includes an output terminal (not illustrated) that outputs the synthesized signal at the coupling point P31.

For example, the capacitance elements 31A-1 and 31A-2 are mounted on a touch panel, and are arranged in different two of a plurality of "unit regions" included in a "pressure detection region" of the touch panel, respectively. When a pressure is applied to the unit region where the capacitance element 31A-1 is arranged, a capacitance value of the capacitance element 31A-1 is changed. Meanwhile, when a pressure is applied to the unit region where the capacitance element 31A-2 is arranged, a capacitance value of the capacitance element 31A-2 is changed. Therefore, a state of the synthesized signal at the coupling point P31 is changed based on whether the unit region to which the pressure is applied is the unit region of the capacitance element 31A-1 or the unit region of the capacitance element 31A-2.

<Configuration Example of Control Device>

As illustrated in FIG. 1, the control device 10 includes signal generators 11-1 and 11-2, drivers 12-1 and 12-2, a receiving circuit (receiving unit) 13, and a control unit 14. The control device 10 is achieved by an integrated circuit, for example.

The signal generator 11-1 is controlled by the control unit 14 to output a positive-phase sine wave to the driver 12-1. The signal generator 11-2 is controlled by the control unit 14 to output a reverse-phase sine wave to the driver 12-2.

The driver 12-1 performs impedance conversion for the positive-phase sine wave received from the signal generator 11-1, and outputs an obtained "positive-phase signal" to the terminal T1. This terminal T1 is coupled to the other end of the capacitance element 31A-1, which is an end on the opposite side to the coupling point P31, as described above. That is, the driver 12-1 applies the positive-phase signal to the capacitance element 31A-1 from the opposite side to the coupling point P31.

The driver 12-2 performs impedance conversion for the reverse-phase sine wave received from the signal generator 11-2, and outputs an obtained "reverse-phase signal" to the terminal T2. This terminal T2 is coupled to the other end of the capacitance element 31A-2, which is an end on the opposite side to the coupling point P31, as described above.

That is, the driver 12-2 applies the reverse-phase signal to the capacitance element 31A-2 from the opposite side to the coupling point P31. The "reverse-phase signal" is ideally a signal having a reverse phase to the above-described "positive-phase signal" and the same amplitude as the "positive-phase signal".

The receiving circuit 13 includes an amplifier 13A and an analog-to-digital converter (ADC) 13B. The amplifier 13A amplifies the synthesized signal (potential fluctuation) at the coupling point P31, received via the terminal T3, and outputs the amplified synthesized signal to the analog-to-digital converter 13B. The analog-to-digital converter 13B converts the amplified synthesized signal received from the amplifier 13A from an analog signal to a digital signal, and outputs the obtained digital signal to the control unit 14.

The control unit 14 detects pressures applied to the capacitance elements 31A-1 and 31A-2 based on the synthesized signal (potential fluctuation) at the coupling point P31. For example, the control unit 14 detects the pressures applied to the capacitance elements 31A-1 and 31A-2 based on the digital signal obtained by the receiving circuit 13 from the synthesized signal at the coupling point P31.

Specifically, the control unit 14 uses the digital signal received from the receiving circuit 13 to calculate both the phase and the amplitude of the synthesized signal at the coupling point P31.

The control unit 14 then detects the pressures applied to the capacitance elements 31A-1 and 31A-2 based on the phase and the amplitude of the synthesized signal that have been calculated. For example, the control unit 14 pre-stores therein a phase value and an amplitude value corresponding to the synthesized signal (potential fluctuation) at the coupling point P31 when no pressure is applied to both the capacitance elements 31A-1 and 31A-2, as a "determination reference". The control unit 14 compares the calculated phase and the calculated amplitude of the synthesized signal and the pre-stored determination reference with each other, and detects the pressures applied to the capacitance elements 31A-1 and 31A-2 based on the comparison result. Further, the control unit 14 can calculate a difference between the calculated amplitude and the amplitude value of the "determination reference" and can calculate a value of the applied pressure based on the calculated difference.

<Operation Example of Pressure Sensor Device>

An operation example of the pressure sensor device having the above configuration is described. FIG. 2 is an explanatory diagram of a main operation of the pressure sensor device. FIG. 3 is an explanatory diagram of a synthesized signal in an ideal state.

As illustrated in FIG. 2, the driver 12-1 applies a positive-phase signal to the capacitance element 31A-1 from an opposite side to the coupling point P31. The driver 12-2 applies a reverse-phase signal to the capacitance element 31A-2 from an opposite side to the coupling point P31.

The coupling point P31 between the capacitance element 31A-1 and the capacitance element 31A-2 synthesizes the positive-phase signal that has passed through the capacitance element 31A-1 and the reverse-phase signal that has passed through the capacitance element 31A-2 with each other.

In an "ideal state", the positive-phase signal and the reverse-phase signal respectively output from the driver 12-1 and the driver 12-2 have reverse phases to each other and the same amplitude as each other. Further, a capacitance value of the capacitance element 31A-1 and a capacitance value of the capacitance element 31A-2 are the same as each other. Therefore, in the "ideal state", when no pressure is applied to both the capacitance element 31A-1 and the capacitance element 31A-2, the positive-phase signal and the reverse-phase signal are entirely canceled out at the coupling point P31. Accordingly, when no pressure is applied to both the capacitance element 31A-1 and the capacitance element 31A-2 in the "ideal state", a synthesized signal S2 at the coupling point P31 is a signal with an amplitude of zero, as illustrated in FIG. 3.

Meanwhile, when a pressure is applied to the capacitance element 31A-1, the capacitance value of the capacitance element 31A-1 is largely changed as compared with when no pressure is applied. Thus, the amplitude of the positive-phase signal that has passed through the capacitance element 31A-1 is larger in the state where a pressure is applied than in the state where no pressure is applied. Therefore, when a pressure is applied to the capacitance element 31A-1, the positive-phase signal is more dominant in the synthesized signal than the reverse-phase signal, so that a synthesized signal S1 is obtained which has the same phase as the positive-phase signal and an amplitude corresponding to a value of the pressure applied to the capacitance element 31A-1 (see FIG. 3).

Similarly, when a pressure is applied to the capacitance element 31A-2, the capacitance value of the capacitance element 31A-2 is largely changed as compared with when no pressure is applied. Thus, the amplitude of the reverse-phase signal that has passed through the capacitance element 31A-2 is larger in the state where a pressure is applied than in the state where no pressure is applied. Therefore, when a pressure is applied to the capacitance element 31A-2, the reverse-phase signal is more dominant in the synthesized signal than the positive-phase signal, so that a synthesized signal S3 is obtained which has the same phase as the reverse-phase signal and an amplitude corresponding to a value of the pressure applied to the capacitance element 31A-2 (see FIG. 3).

Amplification and analog-to-digital conversion are then performed for the synthesized signal (potential fluctuation) at the coupling point P31 by the receiving circuit 13 that includes the amplifier 13A and the analog-to-digital converter 13B, and an obtained digital signal is input to the control unit 14.

The control unit 14 stores therein an amplitude value of zero and a phase value of the positive-phase signal as a "determination reference", for example, in an ideal state. The control unit 14 uses the digital signal received from the receiving circuit 13 to calculate the phase and the amplitude of the synthesized signal at the coupling point P31. The control unit 14 then compares the phase and the amplitude that have been calculated and the determination reference with each other, and determines that a pressure is applied to the capacitance element 31A-1 when, as a result of comparison, the calculated amplitude value is not zero and the calculated phase and the determination reference are coincident with each other. Meanwhile, when the calculated amplitude value is not zero and the calculated phase is not coincident with the determination reference, the control unit 14 determines that a pressure is applied to the capacitance element 31A-2. In this manner, the control unit 14 can detect pressures applied to two capacitance elements 31A-1 and 31A-2 at one timing. When the calculated amplitude value of the synthesized signal is zero and constant, the control unit 14 can determine that no pressure is applied to either of the capacitance elements 31A-1 and 31A-2.

Next, a case of a "non-ideal state" is described. FIG. 4 is an explanatory diagram of a synthesized signal in the non-ideal state.

In the "non-ideal state", a positive-phase signal and a reverse-phase signal do not have reverse phases to each other, and the amplitudes thereof are not the same as each other, for example. Further, a capacitance value of the capacitance element 31A-1 and a capacitance value of the capacitance element 31A-2 are different from each other, for example. This is caused by an individual difference between the drivers 12-1 and 12-2 and an individual difference between the capacitance elements 31A-1 and 31A-2. Therefore, in the "non-ideal state", the positive-phase signal and the reverse-phase signal are not entirely canceled out at the coupling point P31 even when no pressure is applied to both the capacitance elements 31A-1 and 31A-2. Accordingly, even when no pressure is applied to both the capacitance element 31A-1 and the capacitance element 31A-2 in the "non-ideal state", a synthesized signal S12 at the coupling point P31 is a signal with a non-zero amplitude, as illustrated in FIG. 4. In the example illustrated in FIG. 4, the synthesized signal S12 is a signal having the same phase as the positive-phase signal and a non-zero amplitude. The control unit 14 stores therein a phase value and an amplitude value at this time as a "determination reference", for example.

On the other hand, when a pressure is applied to the capacitance element 31A-1, the positive-phase signal is more dominant in the synthesized signal than the reverse-phase signal, so that a synthesized signal S11 is obtained which has the same phase as the positive-phase signal and an amplitude corresponding to a value of the pressure applied to the capacitance element 31A-1 (see FIG. 4). To be accurate, a difference value between the amplitude value of the synthesized signal S11 and the amplitude value of the synthesized signal S12 (that is, the amplitude value of the above "determination reference") is a value corresponding to the value of the pressure applied to the capacitance element 31A-1.

Further, when a pressure is applied to the capacitance element 31A-2, the reverse-phase signal is more dominant in the synthesized signal than the positive-phase signal, so that a synthesized signal S13 is obtained which has the same phase as the reverse-phase signal and an amplitude corresponding to a value of the pressure applied to the capacitance element 31A-2 (see FIG. 4). In the example illustrated in FIG. 4, the synthesized signal S12 is a signal having the same phase as the positive-phase signal and a non-zero amplitude, as described above. Therefore, when the pressure applied to the capacitance element 31A-2 is low, a synthesized signal may be obtained which has the same phase as the positive-phase signal and an amplitude corresponding to the value of the pressure applied to the capacitance element 31A-2. To be accurate, a difference value between the amplitude value of the synthesized signal S13 and the amplitude value of the synthesized signal S12 (that is, the amplitude value of the above "determination reference") is a value corresponding to the value of the pressure applied to the capacitance element 31A-2.

Amplification and analog-to-digital conversion are then performed for the synthesized signal (potential fluctuation) at the coupling point P31 by the receiving circuit 13 including the amplifier 13A and the analog-to-digital converter 13B, and an obtained digital signal is input to the control unit 14.

In the non-ideal state, the control unit 14 stores therein the phase value and the amplitude value of the synthesized signal S12 as a "determination reference", for example, as described above. The control unit 14 uses the digital signal received from the receiving circuit 13 to calculate the phase and the amplitude of the synthesized signal at the coupling point P31. When the phase and the amplitude that have been calculated are coincident with the "determination reference", the control unit 14 determines that no pressure is applied to both the capacitance elements 31A-1 and 31A-2. Further, when the calculated phase is coincident with the phase of the "determination reference" and the calculated amplitude is larger than the amplitude of the "determination reference", the control unit 14 determines that a pressure is applied to the capacitance element 31A-1 in the example of the synthesized signal S12. Further, when the calculated phase is coincident with the phase of the "determination reference" and the calculated amplitude is smaller than the amplitude of the "determination reference", the control unit 14 determines that a pressure is applied to the capacitance element 31A-2 in the example of the synthesized signal S12. Furthermore, when the calculated phase is not coincident with the phase of the "determination reference", the control unit 14 determines that a pressure is applied to the capacitance element 31A-2 in the example of the synthesized signal S12.

As described above, according to the first embodiment, in the control device 10, the driver 12-1 applies a positive-phase signal to the capacitance element 31A-1 from an opposite side to the coupling point P31. The driver 12-2 applies a reverse-phase signal to the capacitance element 31A-2 from an opposite side to the coupling point P31. The control unit 14 detects pressures applied to the capacitance elements 31A-1 and 31A-2 based on a potential fluctuation at the coupling point P31.

By this configuration of the control device 10, it is possible to detect, at one timing, whether a pressure is applied to either of the two capacitance elements 31A-1 and 31A-2 or no pressure is applied to both the two capacitance elements 31A-1 and 31A-2. Therefore, it is possible to improve the efficiency of pressure detection.

Second Embodiment

<Configuration Example of Pressure Sensor Device>

FIG. 5 is a block diagram of an example of a pressure sensor device according to a second embodiment. In FIG. 5, a pressure sensor device 2 includes a control device 40 and a pressure sensor group 60. The pressure sensor group 60 is electrically coupled to the control device 40 via terminals T1, T2, and T3 of the control device 40 as "first loads". The pressure sensor group 60 can be configured to be attachable to and detachable from the control device 40.

<Configuration Example of Pressure Sensor Group>

As illustrated in FIG. 5, the pressure sensor group 60 includes four pressure sensor units 30. A first pressure sensor unit 30 includes two capacitance elements 31A-1 and 31A-2. A second pressure sensor unit 30 includes two capacitance elements 31B-1 and 31B-2. A third pressure sensor unit 30 includes two capacitance elements 31C-1 and 31C-2. A fourth pressure sensor unit 30 includes two capacitance elements 31D-1 and 31D-2. The first, second, third, and fourth pressure sensor units 30 are provided in parallel to one another.

In the first pressure sensor unit 30, the capacitance element 31A-1 is coupled to a terminal T1-1, the capacitance element 31A-2 is coupled to a terminal T2-1, and a coupling point between the capacitance element 31A-1 and the capacitance element 31A-2 is coupled to a terminal T3-1. The terminal T1-1 and the terminal T2-1 can be called a "first output terminal pair".

Similarly, the second pressure sensor unit 30 is coupled to terminals T1-2, T2-2, and T3-2. The terminal T1-2 and the terminal T2-2 can be called a "second output terminal pair". Similarly, the third pressure sensor unit 30 is coupled to terminals T1-3, T2-3, and T3-3. The terminal T1-3 and the terminal T2-3 can be called a "third output terminal pair". Similarly, the fourth pressure sensor unit 30 is coupled to terminals T1-4, T2-4, and T3-4. The terminal T1-4 and the terminal T2-4 can be called a "fourth output terminal pair". The terminals T1-1, T1-2, T1-3, and T1-4 can be generically called the terminal T1.

<Configuration Example of Control Device>

As illustrated in FIG. 5, the control device 40 includes a signal generator 41, current drivers 42-1, 42-2, 42-3, and 42-4, switch units 43, 44, 45, and 46, and a control unit 47. The control device 40 also includes four receiving circuits 13-1, 13-2, 13-3, and 13-4. Each of the four receiving circuits 13-1, 13-2, 13-3, and 13-4 has the same configuration as the receiving circuit 13 described in the first embodiment. The control device 40 is achieved by an integrated circuit, for example. The current drivers 42-1, 42-2, 42-3, and 42-4 can be generically called a current driver 42. The receiving circuits 13-1, 13-2, 13-3, and 13-4 can be generically called a receiving circuit 13.

Here, a mode of the control device 40 when the pressure sensor group 60 (the first load) is coupled to the control device 40 is called a "first mode (pressure detection mode)". Further, a mode of the control device 40 when a second load is coupled to the control device 40 is called a "second mode". The first mode and the second mode can be switched in a time-division manner.

The switch unit 44 is controlled by the control unit 47 to switch a terminal to be coupled to the driver 12-1 among the terminals T1-1, T1-2, T1-3, and T1-4 in turn in the first mode. The switch unit 45 is controlled by the control unit 47 to switch a terminal to be coupled to the driver 12-2 among the terminals T2-1, T2-2, T2-3, and T2-4 in turn in the first mode. That is, the switch units 44 and 45 sequentially switch a terminal pair to be coupled to the drivers 12-1 and 12-2 among the first output terminal pair, the second output terminal pair, the third output terminal pair, and the fourth output terminal pair. Thus, it is possible to apply a positive-phase signal and a reverse-phase signal to each of the first, second, third, and fourth pressure sensor units 30 at a different timing.

The terminal T3-1 and the receiving circuit 13-1 are coupled to each other via the switch unit 46. Similarly, the terminal T3-2 and the receiving circuit 13-2 are coupled to each other via the switch unit 46. The terminal T3-3 and the receiving circuit 13-3 are coupled to each other via the switch unit 46. The terminal T3-4 and the receiving circuit 13-4 are coupled to each other via the switch unit 46. The switch unit 46 is normally off and places the terminal T3 and the receiving circuit 13 in an uncoupled state (non-conducting state). In the first mode, the switch unit 46 is controlled by the control unit 47 to place the terminal T3-1 and the receiving circuit 13-1 in a coupled state (conducting state) at a timing t1 at which the first output terminal pair is coupled to the drivers 12-1 and 12-2. The switch unit 46 places the terminal T3-2 and the receiving circuit 13-2 in a coupled state (conducting state) at a timing t2 at which the second output terminal pair is coupled to the drivers 12-1 and 12-2. The switch unit 46 places the terminal T3-3 and the receiving circuit 13-3 in a coupled state (conducting state) at a timing t3 at which the third output terminal pair is coupled to the drivers 12-1 and 12-2. The switch unit 46 places the terminal T3-4 and the receiving circuit 13-4 in a coupled state (conducting state) at a timing t4 at which the fourth output terminal pair is coupled to the drivers 12-1 and 12-2.

Thus, the control unit 47 can sequentially acquire a digital signal obtained from a synthesized signal at a coupling point in each of the first pressure sensor unit 30, the second pressure sensor unit 30, the third pressure sensor unit 30, and the fourth pressure sensor unit 30 in a time-division manner.

The control unit 47 then detects a pressure applied to the pressure sensor unit 30 based on the digital signal received from the receiving circuit 13 in the first mode.

In the first mode, the switch unit 43 is normally off and places the signal generator 41 and the current drivers 42-1, 42-2, 42-3, and 42-4 in an uncoupled state (non-conducting state). That is, in the first mode, the switch unit 43 switches to a non-output state where a positive-phase current signal is not output from the current drivers 42-1, 42-2, 42-3, and 42-4. On the other hand, in the second mode, the switch unit 43 places the signal generator 41 and the current drivers 42-1, 42-2, 42-3, and 42-4 in a coupled state (conducting state). That is, in the second mode, the switch unit 43 switches to an output state where a positive-phase current signal is output from the current drivers 42-1, 42-2, 42-3, and 42-4.

The signal generator 41 outputs a positive-phase sine wave to the switch unit 43. Therefore, the positive-phase sine wave is not input to the current drivers 42-1, 42-2, 42-3, and 42-4 in the first mode, but is input to the current drivers 42-1, 42-2, 42-3, and 42-4 in the second mode.

In the second mode, each of the current drivers 42-1, 42-2, 42-3, and 42-4 converts the input positive-phase sine wave to a positive-phase current signal, and outputs the obtained positive-phase current signal to a corresponding one of the terminals T3-1, T3-2, T3-3, and T3-4. That is, in the second mode, the terminals T3-1, T3-2, T3-3, and T3-4 serve as output terminals.

In the second mode, the switch unit 44 is controlled by the control unit 47 to place the driver 12-1 and the terminals T1-1, T1-2, T1-3, and T1-4 in an uncoupled state (non-conducting state). On the other hand, in the second mode, the switch unit 45 is controlled by the control unit 47 to place the driver 12-2 and the terminals T2-1, T2-2, T2-3, and T2-4 in a coupled state (conducting state).

As described above, the current driver 42 outputs a positive-phase current signal and the driver 12-2 outputs a reverse-phase signal. Therefore, in the second mode, the control device 40 can apply high voltage obtained by adding an absolute voltage value of the positive-phase current signal and an absolute voltage value of the reverse-phase signal to each other, to the second load coupled between the terminal T3 and the terminal T2. That is, the second mode can be called a "high-voltage supply mode". The second load is not specifically limited, but can be a position detection circuit that is mounted on a display and is used for detecting the position of an electromagnetic-induction (EMR) type pen, for example.

As described above, according to the second embodiment, the drivers 12-1 and 12-2 in the control device 40 apply a positive-phase signal and a reverse-phase signal to the first to fourth pressure sensor units 30 in such a manner that application timings do not overlap each other.

By this configuration of the control device 40, pressure detection for the pressure sensor units 30 can be sequentially performed in a time-division manner.

In the first mode, the control unit 47 of control device 40 switches the switch units 44 and 45 to a conducting state where the drivers 12-1 and 12-2 and the terminals T1 and T2 are conducting to each other, respectively. Also, in the first mode, the control unit 47 switches the switch unit 46 to a conducting state where the terminal T3 and the receiving circuit 13 are conducting to each other, and switches the switch unit 43 to the above-described non-output state. In the second mode, the control unit 47 switches the switch unit 44 to a non-conducting state where the driver 12-1 and the terminal T1 are not conducting to each other, and switches the switch unit 45 to a conducting state where the driver 12-2 and the terminal T2 are conducting to each other. Also, in the second mode, the control unit 47 switches the switch unit 46 to a non-conducting state where the terminal T3 and the receiving circuit 13 are not conducting to each other, and switches the switch unit 43 to the above-described output state.

By this configuration of the control device 40, it is possible to achieve a control device that can perform control in two modes. Further, because the driver 12-1 can be shared by the first mode and the second mode, for example, the device scale can be made small.

Although a configuration in which four receiving circuits 13 are provided in the control device 40 is described above as an example, the configuration of the control device 40 is not limited thereto. For example, the receiving circuit 13 can be one. In this case, in the first mode, the switch unit 46 sequentially switches a terminal to be coupled to that one receiving circuit 13 among the terminals T3-1, T3-2, T3-3, and T3-4.

Further, the amplifier 13A can be a variable amplifier. In this configuration, even when a capacitance change with respect to a pressure of a capacitance element included in the first to fourth pressure sensor units 30 is small, it is possible to amplify the capacitance change to match with a dynamic range of the analog-to-digital converter 13B by setting an amplification rate of the amplifier 13A to be high. Therefore, it is possible to improve noise resistance characteristics.

Third Embodiment

<Configuration Example of Pressure Sensor Device>

Figure 6:
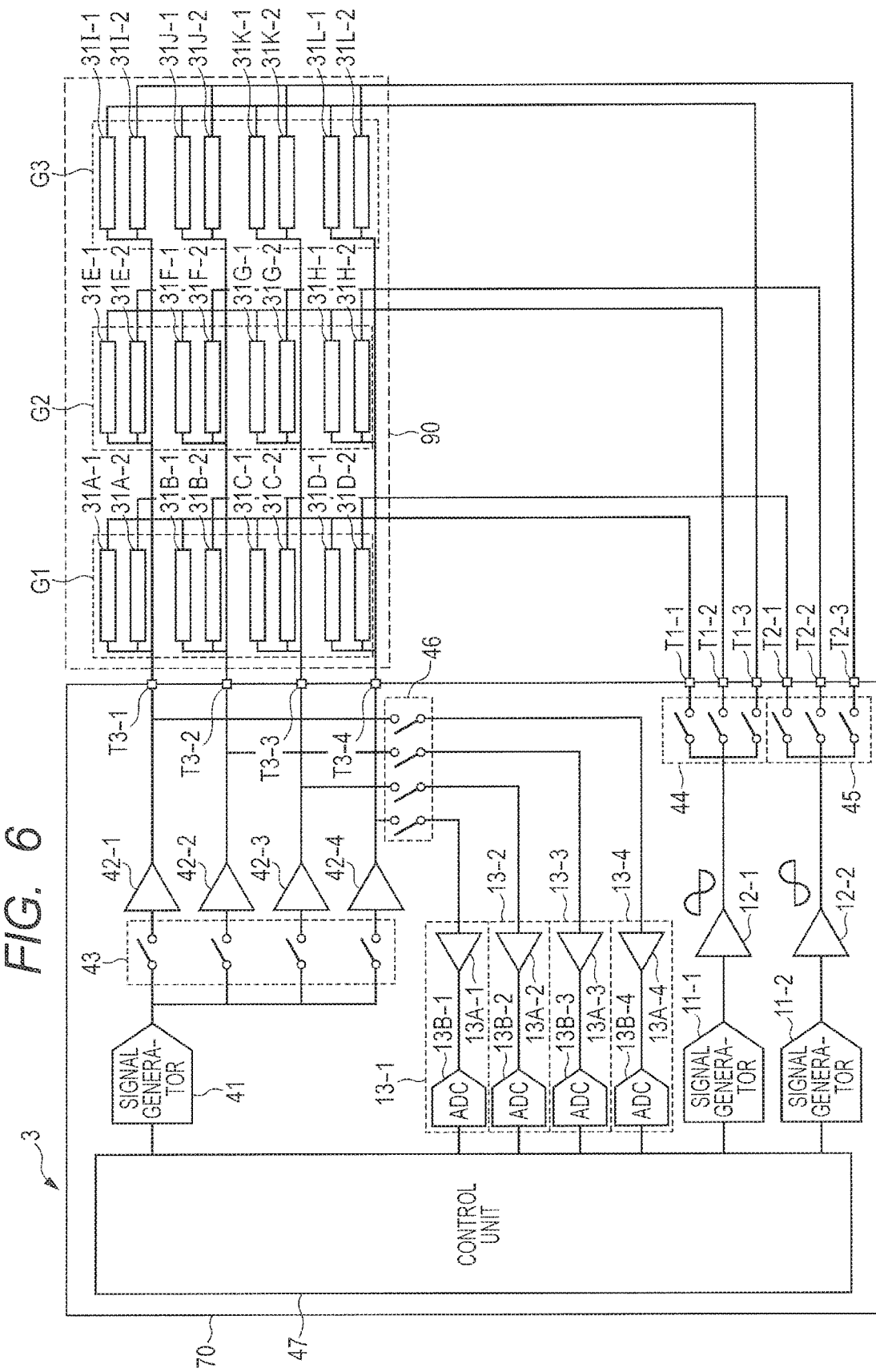
FIG. 6 is a block diagram of an example of a pressure sensor device according to a third embodiment.

FIG. 6 is a block diagram of an example of a pressure sensor device according to a third embodiment. In FIG. 6, a pressure sensor device 3 includes a control device 70 and a pressure sensor group 90. The pressure sensor group 90 is electrically coupled to the control device 70 via terminals T1, T2, and T3 of the control device 70 as "first loads". The pressure sensor group 90 can be configured to be attachable to and detachable from the control device 70.

<Configuration Example of Pressure Sensor Group>

As illustrated in FIG. 6, the pressure sensor group 90 includes 12 pressure sensor units 30. The 12 pressure sensor units 30 are divided into three capacitance groups G1, G2, and G3. Referring to four pressure sensor units 30 included in one capacitance group, the four pressure sensor units 30 are coupled to an output terminal pair including one terminal T1 and one terminal T2 in parallel to one another. Coupling points in the four pressure sensor units 30 are respectively coupled to terminals T3-1, T3-2, T3-3, and T3-4. That is, at one application timing, a positive-phase signal and a reverse-phase signal are applied to all four pressure sensor units 30 included in one capacitance group, and synthesized signals are output from the coupling points in the four pressure sensor units to the terminals T3-1, T3-2, T3-3, and T3-4, respectively.

<Arrangement Example of Pressure Sensor Group>

As described in the first embodiment, two capacitance elements 31 included in a pressure sensor unit 30 are mounted on a touch panel, and are respectively arranged in different two of a plurality of "unit regions" included in a "pressure detection region" of the touch panel, for example. Two capacitance elements 31 included in one pressure sensor unit 30 are preferably arranged in two unit regions that are not adjacent to each other, respectively. By this arrangement, it is possible to prevent simultaneous pressure application to two capacitance elements 31 included in one pressure sensor unit 30 when a user presses a touch panel in an operation. That is, it is possible to reduce the possibility of wrong determination by the control device 70 that no pressure is applied to both two capacitance elements 31 included in one pressure sensor unit 30, caused by simultaneous application of approximately the same level of a pressure to the two capacitance elements 31 included in that pressure sensor unit 30.

Figure 7:
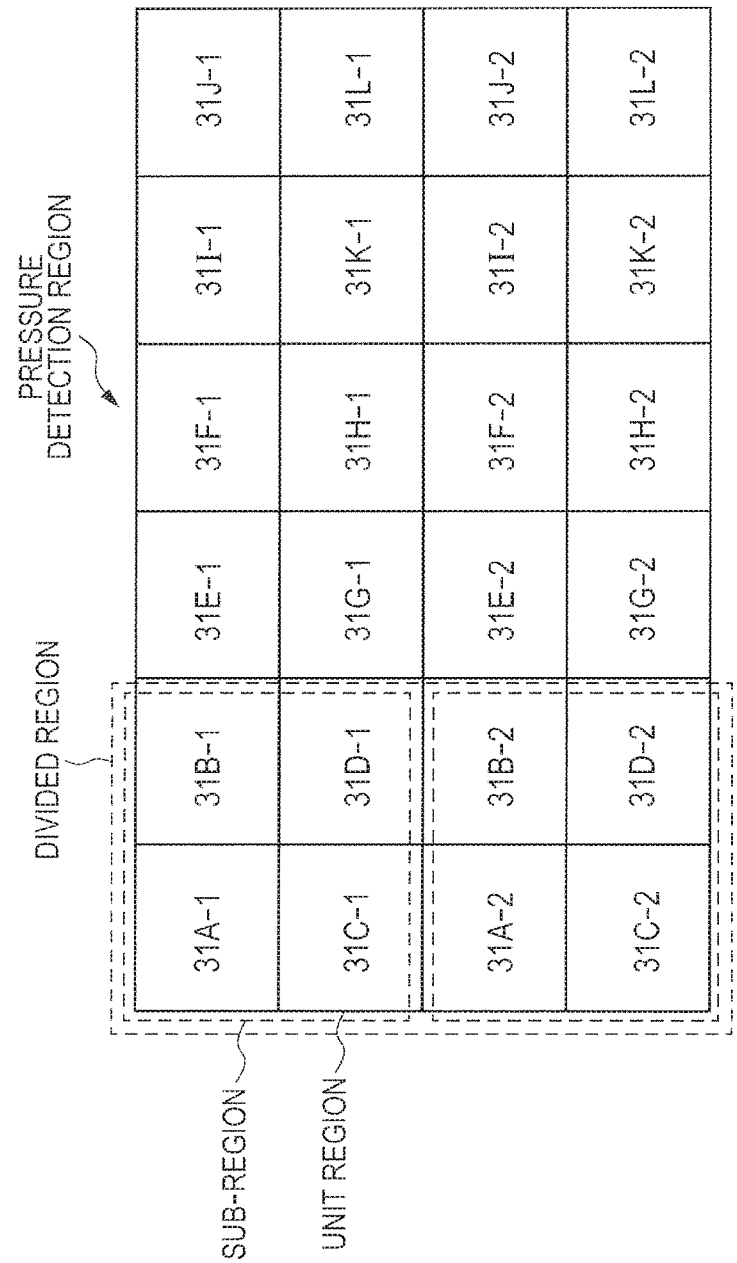
FIG. 7 illustrates an arrangement example of a pressure sensor group.

FIG. 7 illustrates an arrangement example of a pressure sensor group. The whole of the largest rectangle in FIG. 7 is a "pressure detection region". The pressure detection region in FIG. 7 is divided into three "divided regions". These three divided regions correspond to the above-described three capacitance groups G1, G2, and G3, respectively. Each divided region is divided into two "sub-regions".

Referring to a divided region corresponding to the capacitance group G1 in FIG. 7, two capacitance elements 31 included in one pressure sensor unit 30 are arranged in two sub-regions of that divided region, respectively. The two capacitance elements 31 included in the one pressure sensor unit 30 are respectively arranged in two unit regions between which one unit region is sandwiched and which are not adjacent to each other. This can be also applied to the other capacitance groups G2 and G3.

<Configuration Example of Control Device>

As illustrated in FIG. 6, the control device 70 has approximately the same configuration as the control device 40 in the second embodiment. Three terminals T1-1, T1-2, and T1-3 and three terminals T2-1, T2-2, and T2-3 are provided in the control device 70 illustrated in FIG. 6. This is because the number of the capacitance groups in the pressure sensor group 90 is three. Further, four terminals T3-1, T3-2, T3-3, and T3-4 are provided in the control device 70. This is because four pressure sensor units 30 are provided for one capacitance group. That is, the numbers of the terminals T1, T2, and T3 are not limited thereto. The control device 70 is achieved by an integrated circuit, for example.

The switch unit 44 in the third embodiment is controlled by the control unit 47 to switch a terminal to be coupled to the driver 12-1 among the terminals T1-1, T1-2, and T1-3 in turn in the first mode, as in the second embodiment. The switch unit 45 in the third embodiment is controlled by the control unit 47 to switch a terminal to be coupled to the driver 12-2 among the terminals T2-1, T2-2, and T2-3 in turn in the first mode, as in the second embodiment. That is, the switch units 44 and 45 sequentially switch a terminal pair to be coupled to the drivers 12-1 and 12-2 among the first output terminal pair, the second output terminal pair, and the third output terminal pair. Thus, it is possible to apply a positive-phase signal and a reverse-phase signal to each of the capacitance groups G1, G2, and G3 at a different timing.

The switch unit 46 in the third embodiment always places the terminals T3-1, T3-2, T3-3, and T3-4 and the receiving circuits 13-1, 13-2, 13-3, and 13-4 in a coupled state (conducting state) in the first mode, unlike the second embodiment. This is because in the third embodiment, a positive-phase signal and a reverse-phase signal are applied to four pressure sensor units 30 in one capacitance group at one application timing.

From the above, the control unit 47 in the third embodiment receives digital signals from the respective receiving circuits 13-1, 13-2, 13-3, and 13-4 at the same timing. The four digital signals received by the control unit 47 at the same timing correspond to synthesized signals at coupling points in the four pressure sensor units 30 included in the one capacitance group, respectively.

The control unit 47 in the third embodiment then detects pressures applied to the four pressure sensor units 30 included in one capacitance group based on the digital signals received from the receiving circuits 13-1, 13-2, 13-3, and 13-4 at the same timing.

For example, the control unit 47 in the third embodiment uses the digital signal received from the receiving circuit 13 to calculate both the phase and the amplitude of the synthesized signal at the coupling point P31, like the control unit 14 in the first embodiment.

The control unit 47 in the third embodiment then detects a capacitance element 31 to which a pressure is applied based on the phase and the amplitude of the synthesized signal that have been calculated, as in the first embodiment.

Further, the control unit 47 in the third embodiment calculates a value of the pressure applied to the capacitance element 31, as in the first embodiment.

Here, there is a possibility that in an operation, a user presses four unit regions where the capacitance elements 31A-1, 31B-1, 31C-1, and 31D-1 in FIG. 7 are arranged and pressures are applied to the capacitance elements 31A-1, 31B-1, 31C-1, and 31D-1. In this case, the control unit 47 in the third embodiment can calculate values of pressures applied to the respective capacitance elements 31A-1, 31B-1, 31C-1, and 31D-1, and can specify one of the capacitance elements 31 for which the calculated pressure value is the largest as a pressed capacitance element 31 (that is, a capacitance element 31 to which a pressure is applied). Thus, even if a user wrongly presses a region around a button displayed in a display region corresponding to the unit region of the capacitance element 31A-1, for example, together with the button, it is possible to specify the unit region corresponding to the displayed button, to which a higher pressure than to the surrounding region is applied.

As described above, according to the third embodiment, in the control device 70, the drivers 12-1 and 12-2 apply a positive-phase signal and a reverse-phase signal to all four pressure sensor units 30 included in one capacitance group at one application timing. The control unit 47 then detects pressures applied to the four pressure sensor units 30 included in the one capacitance group based on potential fluctuations at coupling points in the four pressure sensor units 30 included in the one capacitance group.

By this configuration of the control device 70, it is possible to more efficiently perform pressure detection.

Further, the drivers 12-1 and 12-2 in the control device 70 apply the positive-phase signal and the reverse-phase signal to the capacitance groups in such a manner that application timings do not overlap each other.

By this configuration of the control device 70, pressure detection for the capacitance groups can be sequentially performed in a time-division manner.

A plurality of capacitance groups in the pressure sensor device 3 are respectively arranged in a plurality of divided regions obtained by dividing a pressure detection region. Each divided region includes two sub-regions. Each sub-region includes a plurality of unit-regions. Two capacitance elements 31 included in each pressure sensor unit 30 included in one capacitance group are respectively arranged in two sub-regions included in divided region corresponding to the one capacitance group.

By this configuration of the pressure sensor device 3, it is possible to reduce the possibility of wrong determination by the control device 70 that no pressure is applied to both two capacitance elements 31 included in one pressure sensor unit 30, caused by simultaneous application of approximately the same level of a pressure to the two capacitance elements 31 included in that pressure sensor unit 30.

Further, in the pressure sensor device 3, the two capacitance elements 31 included in the one pressure sensor unit 30 are respectively arranged in two unit regions that are not adjacent to each other and between which one unit region is sandwiched.

By this configuration of the pressure sensor device 3, it is possible to further reduce the possibility of simultaneous application of approximately the same level of the pressure to the two capacitance elements 31 included in the one pressure sensor unit 30. As a result, it is possible to further reduce the possibility of wrong determination by the control device 70 that no pressure is applied to both the two capacitance elements 31 included in one pressure sensor unit 30, caused by simultaneous application of approximately the same level of a pressure to the two capacitance elements 31 included in that pressure sensor unit 30.

In the above, the invention made by the inventors of the present application has been specifically described by way of the embodiments. However, it is naturally understood that the present invention is not limited to the aforementioned embodiments, and can be changed in various ways within the scope not departing from the gist thereof.

What is claimed is:

1. A pressure sensor device comprising:
   a first capacitance element;
   a second capacitance element coupled to the first capacitance element in series thereto;
   a first driver applying a positive-phase signal to the first capacitance element from an opposite side to a coupling point between the first capacitance element and the second capacitance element;
   a second driver applying a reverse-phase signal to the second capacitance element from an opposite side to the coupling point; and
   a control unit detecting pressures applied to the first capacitance element and the second capacitance element based on a potential fluctuation at the coupling point.

2. The pressure sensor device according to claim 1, wherein the control unit calculates a phase and an amplitude of the potential fluctuation at the coupling point, and detects the pressures applied to the first capacitance element and the second capacitance element based on the calculated phase and the calculated amplitude.

3. The pressure sensor device according to claim 2, wherein the control unit compares the calculated phase and the calculated amplitude and a determination reference with each other, and detects the pressures applied to the first capacitance element and the second capacitance element based on a comparison result, the determination reference corresponding to the potential fluctuation at the coupling point when no pressure is applied to both the first capacitance element and the second capacitance element.

4. The pressure sensor device according to claim 1, further comprising a plurality of capacitance pairs each including the first capacitance element and the second capacitance element,
   wherein the first driver and the second driver apply the positive-phase signal and the reverse-phase signal in such a manner that an application timing for one of the capacitance pairs do not overlap an application timing for another capacitance pair.

5. The pressure sensor device according to claim 1, further comprising a plurality of capacitance groups that respectively correspond to a plurality of divided regions obtained by dividing a pressure detection region,
wherein each of the capacitance groups includes a plurality of capacitance pairs that each include the first capacitance element and the second capacitance element and that are mutually parallel, and
wherein the first driver and the second driver apply the positive-phase signal and the reverse-phase signal in such a manner that an application timing for one of the capacitance groups do not overlap an application timing for another capacitance group.

6. The pressure sensor device according to claim 5,
wherein each of the divided regions includes two sub-regions that are a first sub-region and a second sub-region, and
wherein the first capacitance element and the second capacitance element of each of the capacitance pairs included in each of the capacitance groups are arranged in the first sub-region and the second sub-region, respectively.

7. The pressure sensor device according to claim 6,
wherein each of the first sub-region and the second sub-region includes a plurality of unit regions,
wherein the first capacitance element and the second capacitance element of each of the capacitance pairs are arranged in two of the unit regions that are not adjacent to each other, and
wherein, when having detected pressures applied to a plurality of capacitance elements arranged in the first sub-region, the control unit specifies one of the capacitance elements which is largest in an amplitude value of the potential fluctuation at the coupling point, as a capacitance element to which a pressure is applied.

8. The pressure sensor device according to claim 1, wherein the first capacitance element and the second capacitance element are respectively arranged in two of a plurality of unit regions each of which is obtained by dividing a pressure detection region and in each of which one capacitance element is arranged, the two unit regions being not adjacent to each other.

9. A control device detecting pressures applied to a first capacitance element and a second capacitance element coupled in series to each other, the control device comprising:
a first driver and a second driver outputting a positive-phase signal and a reverse-phase signal, respectively;
a first output terminal for being coupled to the first capacitance element from an opposite side to a coupling point between the first capacitance element and the second capacitance element, the first output terminal outputting the positive-phase signal output from the first driver to the first capacitance element;
a second output terminal for being coupled to the second capacitance element from an opposite side to the coupling point, the second output terminal outputting the reverse-phase signal output from the second driver to the second capacitance element;
an input terminal for being coupled to the coupling point, the input terminal inputting a potential fluctuation at the coupling point; and
a control unit detecting the pressures applied to the first capacitance element and the second capacitance element based on the potential fluctuation input from the input terminal.

10. The control device according to claim 9, wherein the control unit calculates a phase and an amplitude of the potential fluctuation input from the input terminal, and detects the pressures applied to the first capacitance element and the second capacitance element based on the calculated phase and the calculated amplitude.

11. The control device according to claim 10, wherein the control unit compares the calculated phase and the calculated amplitude and a determination reference with each other, and detects the pressures applied to the first capacitance element and the second capacitance element based on a comparison result, the determination result corresponding the potential fluctuation at the coupling point when no pressure is applied to both the first capacitance element and the second capacitance element.

12. The control device according to claim 9, further comprising:
a plurality of output terminal pairs respectively corresponding to a plurality of capacitance pairs that each include the first capacitance element and the second capacitance element, each of the output terminal pairs including the first output terminal and the second output terminal; and
a switch that sequentially switches a terminal pair to be coupled to the first driver and the second driver, among the output terminal pairs.

13. The control device according to claim 9, further comprising:
a plurality of output terminal pairs respectively corresponding to a plurality of capacitance groups each including a plurality of capacitance pairs that each include the first capacitance element and the second capacitance element and that respectively correspond to a plurality of divided regions obtained by dividing a pressure detection region, each of the output terminal pairs including the first output terminal and the second output terminal; and
a switch that sequentially switches a terminal pair to be coupled to the first driver and the second driver, among the output terminal pairs.

14. The control device according to claim 13,
wherein each of the divided regions includes two sub-regions that are a first sub-region and a second sub-region, and
wherein the first capacitance element and the second capacitance element of each of the capacitance pairs included in each of the capacitance group are respectively arranged in the first sub-region and the second sub-region.

15. The control device according to claim 14,
wherein each of the first sub-region and the second sub-region includes a plurality of unit regions,
wherein the first capacitance element and the second capacitance element of each of the capacitance pairs are respectively arranged in two of the unit regions, which are not adjacent to each other, and
wherein, having detected pressures applied to a plurality of capacitance elements arranged in the first sub-region, the control unit specifies one of the capacitance elements which is largest in an amplitude value of the potential fluctuation at the coupling point, as a capacitance element to which a pressure is applied.

16. The control device according to claim 9, wherein the first capacitance element and the second capacitance element are respectively arranged in two of a plurality of unit regions each of which is obtained by dividing a pressure detection region and in each of which one capacitance element is arranged, the two unit regions being not adjacent to each other.

17. The control device according to claim 9, further comprising:
- a receiving circuit including an analog-to-digital converter that quantizes the potential fluctuation input from the input terminal;
- a third driver that is coupled to the input terminal at an output stage thereof and outputs a current signal having a reverse phase to the reverse-phase signal;
- a first switch that switches between a conducting state where the receiving circuit and the input terminal are electrically coupled to each other and a non-conducting state where the receiving circuit and the input terminal are electrically uncoupled;
- a second switch that switches between an output state where the current signal is caused to be output from the third driver and a non-output state where the current signal is not caused to be output; and
- a third switch that switches between a conducting state where the first output terminal and the first driver are conducting to each other and a non-conducting state where the first output terminal and the first driver are not conducting to each other, wherein in a first mode where the control device is coupled to the first capacitance element and the second capacitance element, the control unit controls the first switch, the second switch, and the third switch to place the first switch in the conducting state, the second switch in the non-output state, and the third switch in the conducting state, and wherein, in a second state where the control device is coupled to a load other than the first capacitance element and the second capacitance element, the control unit controls the first switch, the second switch, and the third switch, and places the second switch in the output state to cause the input terminal to serve as a third output terminal outputting the current signal, places the first switch in the non-conducting state, and places the third switch in the non-conducting state.

* * * * *